United States Patent
Kitagawa et al.

(10) Patent No.: US 10,480,069 B2
(45) Date of Patent: Nov. 19, 2019

(54) STORAGE DEVICE, VAPORIZER AND SUBSTRATE PROCESSING APPARATUS

(71) Applicant: Hitachi Kokusai Electric Inc., Tokyo (JP)

(72) Inventors: Naoko Kitagawa, Toyama (JP); Yuichi Wada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/008,825

(22) Filed: Jun. 14, 2018

(65) Prior Publication Data

US 2018/0291502 A1 Oct. 11, 2018

Related U.S. Application Data

(63) Continuation of application No. PCT/JP2016/086222, filed on Dec. 6, 2016.

(30) Foreign Application Priority Data

Dec. 18, 2015 (JP) .................................. 2015-247366

(51) Int. Cl.
  *C23C 16/00* (2006.01)
  *C23C 16/448* (2006.01)
  (Continued)

(52) U.S. Cl.
  CPC ............ *C23C 16/448* (2013.01); *C23C 14/12* (2013.01); *C23C 14/543* (2013.01); *C23C 16/44* (2013.01);
  (Continued)

(58) Field of Classification Search
  CPC .................................................. C23C 14/243
  See application file for complete search history.

(56) References Cited

U.S. PATENT DOCUMENTS 5,451,258 A * 9/1995 Hillman .............. C23C 16/4485
  118/715
7,115,186 B2 * 10/2006 Miyamoto .............. B01B 1/005
  159/16.1

(Continued)

FOREIGN PATENT DOCUMENTS

JP 2000-046631 * 2/2000 ............. G01F 23/28
JP 2007-227471 A 9/2007

OTHER PUBLICATIONS

English translation JP 2000-046631, Hayashi, Feb. 2000 (Year: 2000).*

*Primary Examiner* — Keath T Chen
(74) *Attorney, Agent, or Firm* — Edell, Shapiro & Finnan, LLC

(57) ABSTRACT

A storage device includes: a sidewall formed in a cylindrical shape; a cover wall disposed at an upper end of the sidewall; a bottom wall connected to a lower end of the sidewall and comprising a mounting surface mountable on a weight detector; a storage chamber surrounded by the sidewall, the cover wall, and the bottom wall; a recess communicating with the storage chamber and provided at the bottom wall; a communication pipe having one end connected to a bottom portion of the recess in a direction of gravity and the other end extending in a direction different from the direction of gravity in the bottom wall, the communication pipe having a diameter smaller than that of the recess; a gas flow path provided at a wall other than the bottom wall; and a liquid discharge path connected to a downstream side of the communication pipe.

13 Claims, 9 Drawing Sheets

(51) Int. Cl.
*C23C 16/44* (2006.01)
*H01L 21/31* (2006.01)
*C23C 16/52* (2006.01)
*C23C 14/12* (2006.01)
*C23C 14/54* (2006.01)
*C23C 16/455* (2006.01)

(52) U.S. Cl.
CPC .... *C23C 16/4412* (2013.01); *C23C 16/45561* (2013.01); *C23C 16/52* (2013.01); *H01L 21/31* (2013.01)

(56) References Cited

U.S. PATENT DOCUMENTS

| | | | | |
|---|---|---|---|---|
| 2002/0127875 | A1* | 9/2002 | Weidman | C23C 16/30 |
| | | | | 438/778 |
| 2005/0224523 | A1* | 10/2005 | O' Dougherty | B67D 7/0261 |
| | | | | 222/399 |
| 2013/0294944 | A1* | 11/2013 | Hirosawa | B01D 61/06 |
| | | | | 417/53 |
| 2014/0209022 | A1* | 7/2014 | Inoue | G05D 16/00 |
| | | | | 118/712 |

* cited by examiner

US 10,480,069 B2

STORAGE DEVICE, VAPORIZER AND SUBSTRATE PROCESSING APPARATUS

CROSS REFERENCE TO RELATED APPLICATIONS

This application is a continuation of International Application No. PCT/JP2016/086222, filed on Dec. 6, 2016, which claims priority under 35 U.S.C. § 119 to Application No. JP 2015-247366 filed on Dec. 18, 2015, the entire contents of which are hereby incorporated by reference.

TECHNICAL FIELD

The present disclosure relates to a storage device for storing a liquid, a vaporizer and a substrate processing apparatus.

BACKGROUND

There are processing apparatuses configured to process objects to be processed using a liquid. Such apparatuses include a container serving as a storage tank provided before a process chamber and configured to store the liquid. For example, the storage tank is used to control the supply of the liquid to the process chamber.

High productivity is required for such processing apparatuses. In order to achieve high productivity, for example, the maintenance time of such processing apparatuses can be shortened.

SUMMARY

Described herein is a technique capable of providing a processing apparatus that can achieve high productivity or a structure for realizing high productivity.

According to one aspect of the technique described herein, there is provided a storage device including: a sidewall formed in a cylindrical shape; a cover wall disposed at an upper end of the sidewall; a bottom wall connected to a lower end of the sidewall and comprising a mounting surface mountable on a weight detector; a storage chamber surrounded by the sidewall, the cover wall, and the bottom wall; a recess communicating with the storage chamber and provided at the bottom wall; a communication pipe having one end connected to a bottom portion of the recess in a direction of gravity and the other end extending in a direction different from the direction of gravity in the bottom wall, the communication pipe having a diameter smaller than that of the recess; a gas flow path provided at a wall different from the bottom wall; and a liquid discharge path connected to a downstream side of the communication pipe.

DETAILED DESCRIPTION

Figure 1:
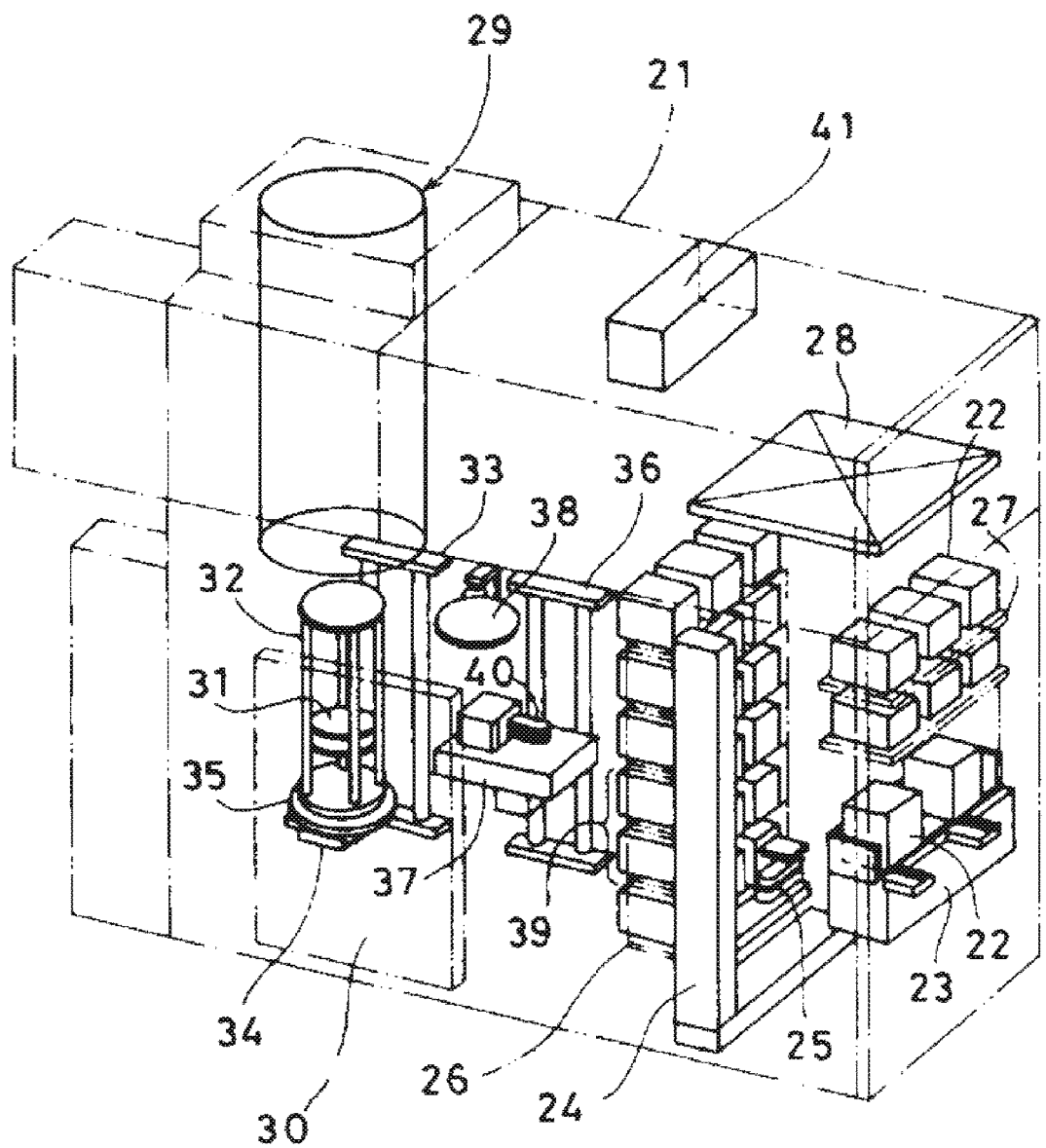
FIG. 1 schematically illustrates a processing apparatus according to a first embodiment described herein.

Hereinafter, embodiments will be described with reference to the drawings.
First Embodiment FIG. 1 schematically illustrates a substrate processing apparatus, which is an example of a processing apparatus of the present disclosure. Hereinafter, the substrate processing apparatus will be described with reference to FIG. 1.

A cassette stage 23 serving as a container transfer means for transferring a cassette 22 serving as a substrate container to an external transfer device (not shown) and from the external transfer device is provided at the front side in a housing 21. A cassette elevator 24 serving as an elevating means is provided at the rear side of the cassette stage 23. The cassette elevator 24 is provided with a cassette transfer device 25 serving as a cassette transfer means. A cassette shelf 26 serving as a means for storing the cassette 22 is provided on the rear side of the cassette elevator 24. A spare cassette shelf 27 serving as a cassette storage means is provided above the cassette stage 23. A clean air supply mechanism 28 constituted by a fan (not shown) and a dustproof filter (not shown) is provided above the spare cassette shelf 27. The clean air supply mechanism 28 is configured to circulate clean air in the interior of the housing 21, for example, an area where the cassette 22 is transferred.

A substrate processing furnace 29 is provided above the rear portion of the housing 21. A boat elevator 33 serving as an elevating means for loading a boat 32 into the substrate processing furnace 29 and unloading the boat 32 from the substrate processing furnace 29 is provided above the rear portion of the housing 21. The boat 32 serves as a substrate retaining means for holding (retaining) a wafer 31 such as a substrate. The boat 32 supports the wafer 31 in horizontal orientation in multiple stages. A seal cap 35 serving as a lid for closing a furnace opening portion of the substrate processing furnace 29 is provided at a front end portion of an elevating mechanism 34 attached to the boat elevator 33. The boat 32 is vertically supported by the seal cap 35. Thus, the boat 32 is capable of supporting the wafer 31 in horizontal orientation in multiple stages.

A transfer elevator 36 serving as an elevating means is provided between the boat elevator 33 and the cassette shelf 26. A wafer transfer mechanism 37 serving as a substrate transfer means is provided at the transfer elevator 36. The wafer transfer mechanism 37 includes several (for example, five) substrate transfer plates 40 on which substrates are placed. The substrate transfer plates 40 are configured to move forward and backward and to rotate.

A furnace opening portion shutter 38 serving as a closing part and having an opening/closing mechanism is provided in the vicinity of the lower portion of the substrate processing furnace 29. The furnace opening portion shutter 38 is configured to open and close the furnace opening portion of the substrate processing furnace 29.

A clean air supply mechanism 30 constituted by a fan (not shown) and a dustproof filter (not shown) is provided on a side surface of the housing 21 opposite to the transfer elevator 36. Clean air supplied by the clean air supply mechanism 30 circulates through an area where the wafer transfer mechanism 37, the boat 32 and the boat elevator 33 are provided, and is then exhausted to the outside of the housing 21 by an exhaust apparatus (not shown).

Operations of the above-described components, for example, an operation of the cassette transfer device 25, an operation of the wafer transfer mechanism 37, an operation of the boat elevator 33 and a heating control operation of the substrate processing furnace 29 are controlled by a controller 41 which is described later.

Hereinafter, the operation of the substrate processing apparatus will be described.

The cassette 22 holding the wafer 31 in a vertical orientation is loaded into the cassette stage 23 from the external transfer device (not shown). The cassette 22 is rotated by 90° by the cassette stage 23 such that the wafer 31 is in a horizontal orientation. Then, the cassette 22 is transported from the cassette stage 23 to the cassette shelf 26 or the spare cassette shelf 27 by co-operation of an elevating/lowering operation and a traverse movement operation of the cassette elevator 24 and a moving operation and a rotating operation of the cassette transfer device 25.

The cassette shelf 26 includes a transfer shelf 39 where the cassette 22 to be transferred by the wafer transfer mechanism 37 is stored. The cassette 22 used for transferring the wafer 31 is transferred to the transfer shelf 39 by the cassette elevator 24 and the cassette transfer device 25.

After the cassette 22 is transferred to the transfer shelf 39, by co-operation of moving operations and rotating operations of the substrate transfer plates 40 and an elevating/lowering operation of the transfer elevator 36, the wafer transfer mechanism 37 transfers the wafer 31 from the transfer shelf 39 to the boat 32 unloaded from the substrate processing furnace 29.

When a predetermined number of wafers 31 are charged into the boat 32, the boat 32 is elevated by the boat elevator 33 and is loaded into the substrate processing furnace 29. When the boat 32 is completely loaded into the substrate processing furnace 29, the substrate processing furnace 29 is airtightly closed by the seal cap 35.

Figure 2:
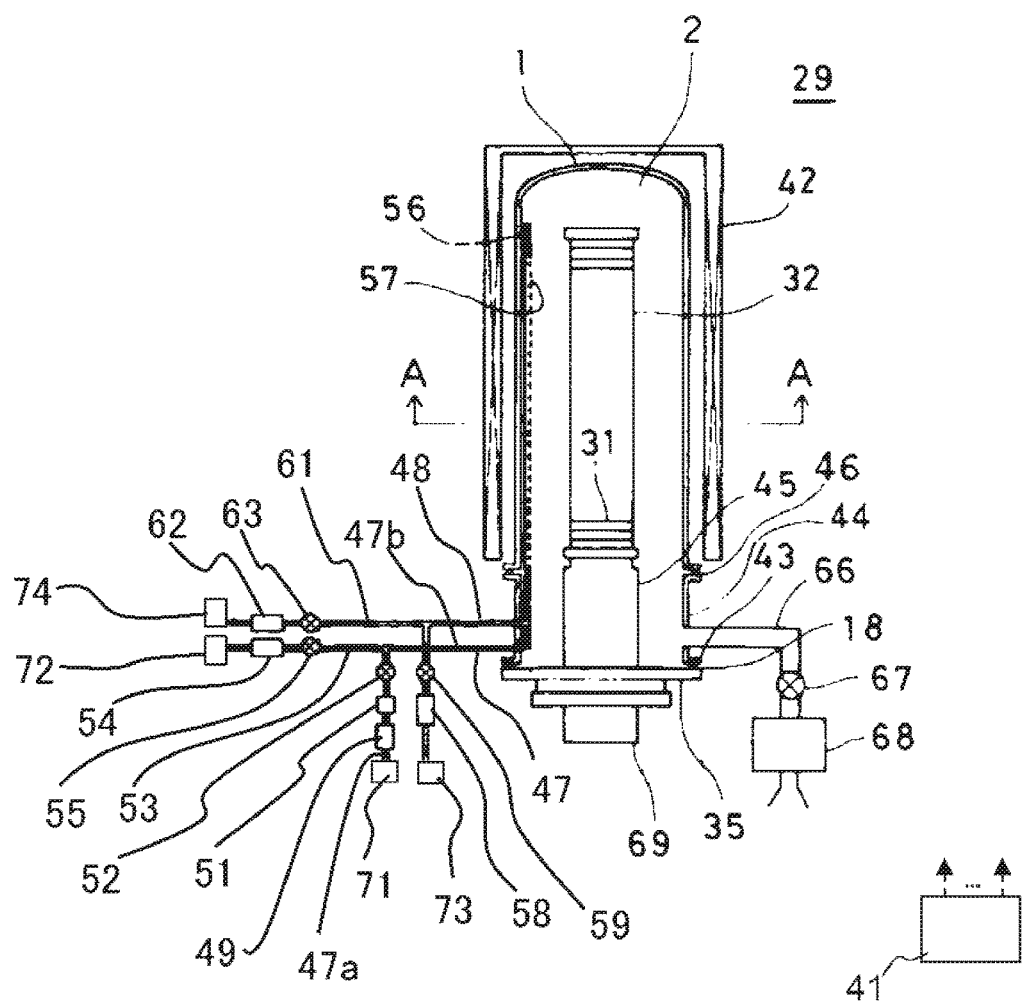
FIG. 2 schematically illustrates a vertical cross-section of a substrate processing furnace of the processing apparatus according to the first embodiment.

After the substrate processing furnace 29 is airtightly closed, a substrate processing is performed according to a selected process recipe by heating the wafer 31, supplying a process gas into the substrate processing furnace 29 and exhausting an atmosphere of the a process chamber 2 shown in FIG. 2 by the exhaust apparatus (not shown) via a gas exhaust pipe 66 shown in FIG. 2.

Figure 3:
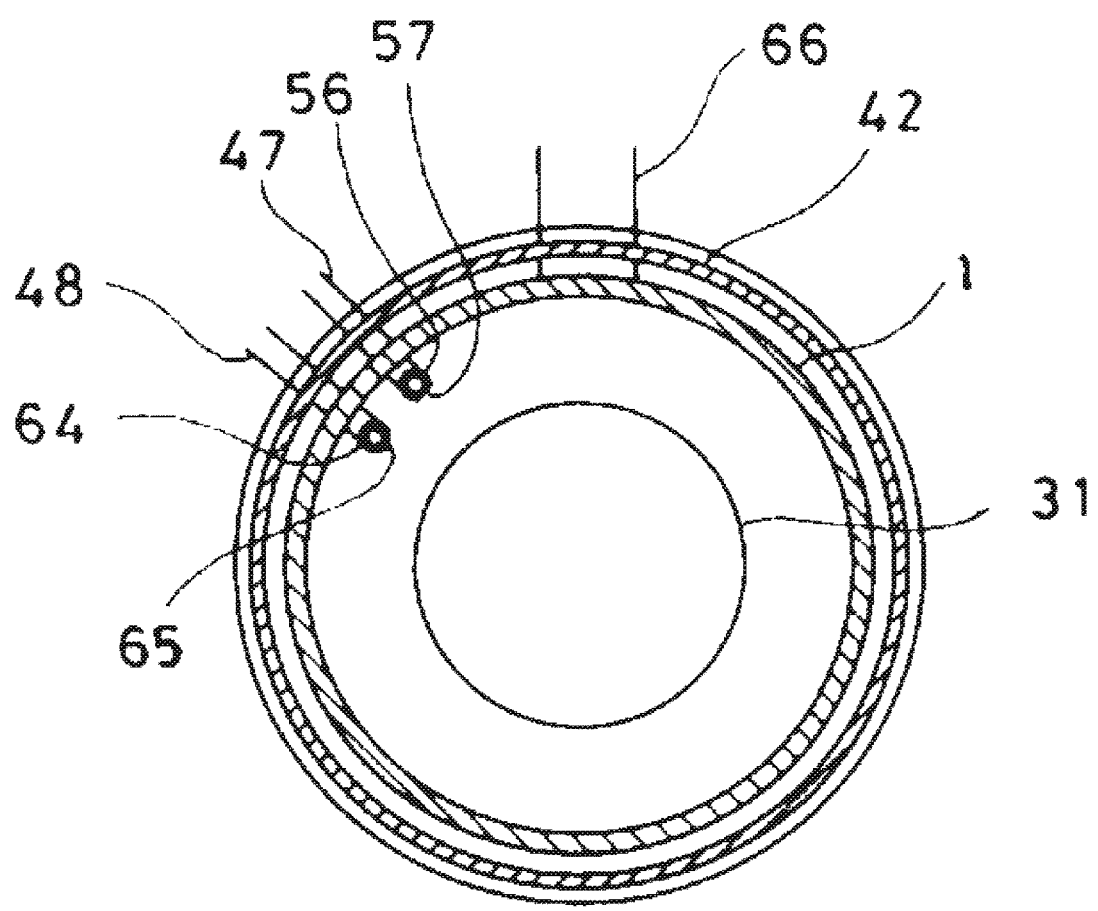
FIG. 3 schematically illustrates a cross-section taken along the line A-A of the substrate processing furnace shown in FIG. 2.

The substrate processing furnace 29, for example, a vertical type substrate processing furnace, used in the substrate processing apparatus will be described with reference to FIGS. 2 and 3.

A reaction tube 1 is provided at inner side of a heater 42 serving as a heating device (heating mechanism). A manifold 44 is provided at the lower end of the reaction tube 1 via an O-ring 46 serving as an airtight sealing member. The manifold 44 is made of metal such as stainless steel. The lower end opening portion (furnace opening portion) of the manifold 44 is air-tightly closed via an O-ring 18 serving as an airtight sealing member by the seal cap 35 serving as a lid. The process chamber 2 is constituted by the reaction tube 1, the manifold 44 and the seal cap 35.

The boat 32 is vertically provided on the seal cap 35 via a boat support 45. The boat support 45 is configured to support the boat 32.

Gas supply pipes for supplying various process gases, for example, two gas supply pipes, that is, a first gas supply pipe 47 and a second gas supply pipe 48 serving as supply paths for supplying two types of processing gases, are provided at the process chamber 2.

A liquid material source 71, a first mass flow controller 49 which is a liquid flow rate controller (liquid flow rate control device), a vaporizer 51 and a valve 52 which is an opening/closing valve are sequentially provided at the first gas supply pipe 47 from the upstream side toward the downstream side of the first gas supply pipe 47. A first carrier gas supply pipe 53 for supplying a carrier gas is connected to the first gas supply pipe 47 at the downstream side of the valve 52. A carrier gas source 72, a second mass flow controller 54 which is a flow rate controller (flow rate control device), and a valve 55 which is an opening/closing valve are sequentially provided at the first carrier gas supply pipe 53 from the upstream side toward the downstream side of the first carrier gas supply pipe 53. A first nozzle 56 is provided at the front end portion of the first gas supply pipe 47 from the bottom to the top of the reaction tube 1 through the inner wall of the reaction tube 1. First gas supply holes 57 are provided at the side of the first nozzle 56. The first gas supply holes 57 are provided at the first nozzle 56 from the lower portion of first nozzle 56 to the upper portion thereof. The first gas supply holes 57 have the same pitch and the same opening area. As will be described later, the vaporizer 51 includes a storage tank structure 200 for storing a liquid material and a heater 215 for heating the liquid material. In the description of the present embodiment, a portion of the first gas supply pipe 47 provided between the vaporizer 51 and the liquid material source 71 is also referred to as a supply pipe 47a and a portion of the first gas supply pipe 47 provided at the downstream side of the vaporizer 51 is also referred to as a supply pipe 47b.

In the present embodiment, the first gas supply pipe 47, the first mass flow controller 49, the vaporizer 51, the valve 52 and the first nozzle 56 are collectively referred to as a first gas supply system. The first gas supply system may further include the carrier gas supply pipe 53, the second mass flow controller 54 and the valve 55. The first gas supply system may further include the liquid material source 71 and the carrier gas source 72.

A reactive gas source 73, a third mass flow controller 58 which is a flow rate controller (flow rate control device) and a valve 59 which is an opening/closing valve are sequentially provided at the second gas supply pipe 48 from the upstream side toward the downstream side of the second gas supply pipe 48. A second carrier gas supply pipe 61 for supplying a carrier gas is connected to the second gas supply pipe 48 at the downstream side of the valve 59. A carrier gas source 74, a fourth mass flow controller 62 which is a flow rate controller (flow rate control device), and a valve 63 which is an opening/closing valve are sequentially provided at the second carrier gas supply pipe 61 from the upstream side toward the downstream side of the second carrier gas supply pipe 61. A second nozzle 64 is provided parallel to the first nozzle 56 at the front end portion of the second gas supply pipe 48. Second gas supply holes 65 are provided at the side of the second nozzle 64. The second gas supply holes 65 are provided at the second nozzle 64 from the lower portion of second nozzle 64 to the upper portion thereof. The second gas supply holes 65 have the same pitch and the same opening area.

In the present embodiment, the second gas supply pipe 48, the third mass flow controller 58, the valve 59 and the second nozzle 64 are collectively referred to as a second gas supply system. The second gas supply system may further include the carrier gas supply pipe 61, the fourth mass flow controller 62 and the valve 63. The second gas supply system may further include the reactive gas source 73 and the carrier gas source 74.

The liquid material supplied from the liquid material source 71 is supplied to the first carrier gas supply pipe 53 via the first mass flow controller 49, the vaporizer 51 and the valve 52, and then supplied into the process chamber 2 through the first nozzle 56. Specifically, the liquid material is vaporized by the vaporizer 51 and the vaporized liquid material is supplied into the process chamber 2. The reactive gas supplied from the reactive gas source 73 is supplied to the second carrier gas supply pipe 61 via the third mass flow controller 58 and the valve 59, and is then supplied to the process chamber 2 via the second nozzle 64.

The process chamber 2 is connected to a vacuum pump 68 which is an exhaust device (exhaust mechanism) through the gas exhaust pipe 66 for exhausting gas. The vacuum pump 68 is capable of exhausting the inner atmosphere of the process chamber 2. A valve 67 which is an opening/closing valve is provided at the gas exhaust pipe 66. The valve 67 may be opened/closed to vacuum-exhaust the process chamber 2 or stop the vacuum exhaust. The opening degree of the valve 67 may be adjusted in order to control the inner pressure of the process chamber 2.

A boat rotating mechanism 69 is provided at the seal cap 35. The boat rotating mechanism 69 is configured to rotate the boat 32 in order to improve process uniformity.

Vaporizer

Figure 4:
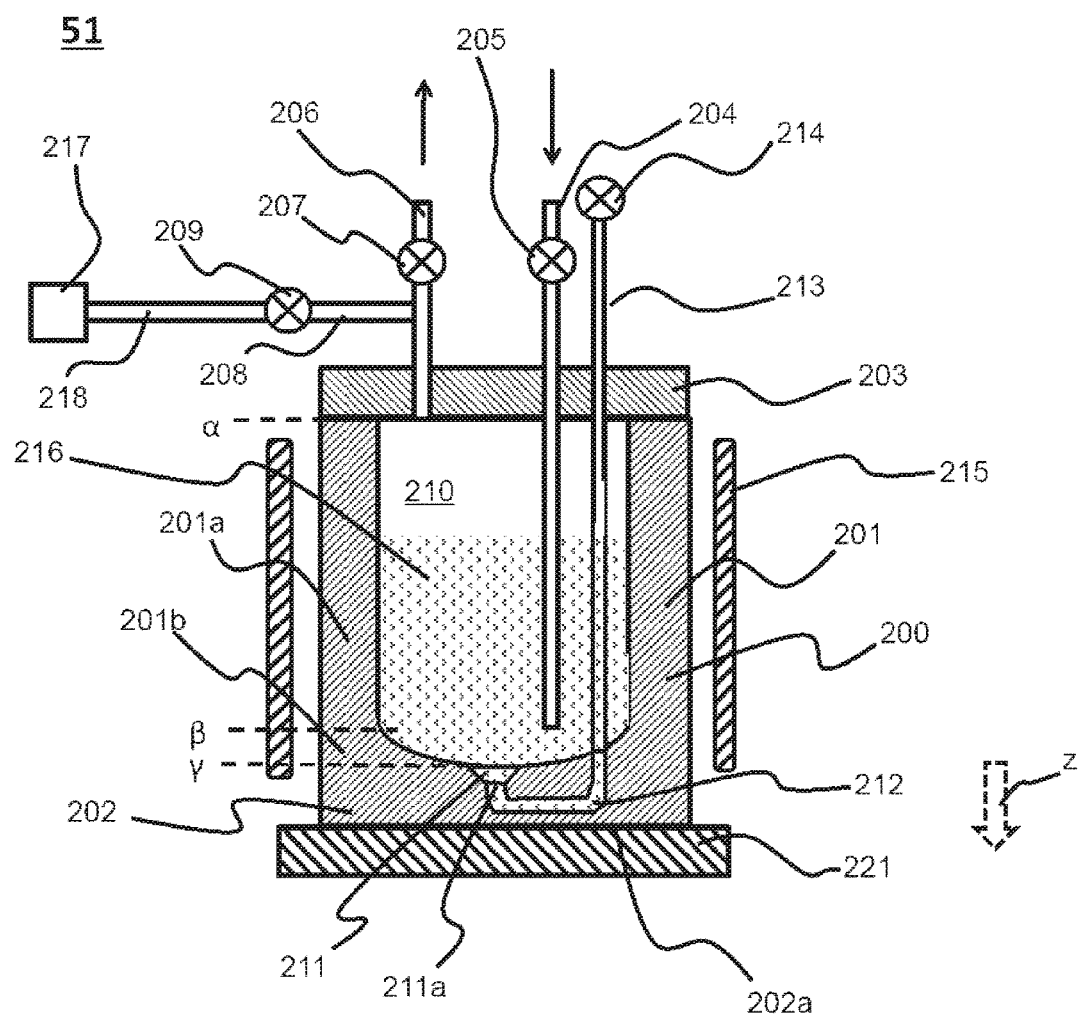
FIG. 4 schematically illustrates a vaporizer including a storage tank structure according to the first embodiment.

Next, the vaporizer 51, which is an example of a vaporizer having the storage tank structure 200, will be described with reference to FIG. 4. The storage tank structure 200 is used as a container configured to store a liquid. FIG. 4 is a cover wall view illustrating a specific structure of the vaporizer 51. The vaporizer 51 includes a sidewall 201, a bottom wall 202, and a cover wall 203 which constitute the storage tank structure 200. For example, the sidewall 201 has a cylindrical shape (circumferential shape). The sidewall 201 includes a sidewall 201a having a tubular structure having the same diameter throughout and a sidewall 201b having a diameter that decreases progressively toward the bottom wall 202. Referring to FIG. 4, the sidewall 201a refers to a portion of the sidewall 201 between α and β, and the sidewall 201b refers to a portion of the sidewall 201 between β and γ.

The sidewall 201a and the sidewall 201b extend continuously from each other without a step therebetween. The diameter of the sidewall 201b decreases progressively toward the bottom wall 202. The sidewall 201b has a curvature that minimizes the influence of the surface tension of the liquid.

To minimize the surface tension of the liquid at contacting surfaces of the sidewall 201 and the bottom wall 202 whereat the liquid contacts the sidewall 201 and the bottom wall 202, it is preferable to reduce the surface areas of the contacting surfaces of the sidewall 201 and the bottom wall 202. To realize this, for example, composite electrolytic polishing is performed on the contacting surfaces. In accordance with the type or properties of the liquid, processes such as passivation, vitrification and fluorine treatment may be performed to prevent reaction with the liquid.

A storage chamber 210 is defined by the sidewall 201, the bottom wall 202, and the cover wall 203. A liquid material is supplied via a liquid material supply pipe 204, which will be described below, to the storage chamber 210 and stored in the storage chamber 210. As illustrated in FIG. 4, the stored liquid material is also referred to as a liquid material 216.

A bottom portion of the bottom wall 202 in the direction of gravity (Z-direction in FIG. 4) is also referred to as a mounting surface 202a that is mountable on (i.e., can be placed directly on) a weight detector 221. For example, the mounting surface 202a has a flat shape so that the mounting surface 202a is stably mounted on the weight detector 221. A weight of the liquid material 216 stored in the storage chamber 210 can be measured by the weight detector 221 detecting a weight of the storage tank structure 200. A residual quantity of liquid can be measured by measuring the weight of the liquid material 216.

The cover wall 203 is connected (fixed) to an upper end of the sidewall 201 by a method such as welding so that the liquid inside the cover wall 203 does not leak. Likewise, the bottom wall 202 is connected (fixed) to a lower end of the sidewall 201 by a method such as welding so that the liquid inside the bottom wall 202 does not leak. By the cover wall 203 and the bottom wall 202 being fixed as above, the leakage of the liquid is prevented when the storage tank structure 200 is transferred with the liquid stored therein or when the storage tank structure 200 is being mounted on the weight detector 221.

A recess 211 is provided in the bottom wall 202. The recess 211 extends continuously from the sidewall 201b. A diameter of the recess 211 is smaller than that of the sidewall 201b. The recess 211 has a conical shape whose diameter decreases progressively toward the bottom. A hole structure 211a is provided at the bottom of the recess 211. A communication pipe 212, which will be described later, is connected to the hole structure 211a.

One end of the communication pipe 212 having a diameter smaller than that of the recess 211 is connected to the hole structure 211a of the recess 211. The communication pipe 212 is also referred to as a communication flow path 212. A discharge pipe 213, which will be described later, is connected to the other end (downstream end) of the communication pipe 212. The discharge pipe 213 is also referred to as a liquid discharge path 231. A diameter of the discharge pipe 213 is smaller than that of the communication pipe 212. For example, the discharge pipe 213 can be inserted into and fixed to the communication pipe 212. The communication pipe 212 is also referred to as a communication structure 212.

A pipe 206 serves as a gas flow path that communicates with the substrate processing furnace 29 and through which a gaseous material, which is vaporized in the storage chamber 210, flows. A supply pipe 47b is connected to a downstream side of the pipe 206. The pipe 206 is provided in a wall other than the bottom wall 202. For example, the pipe 206 is provided at the cover wall 203. In case the pipe 206 is provided in the cover wall 203, the pipe 206 passes through a hole provided in the cover wall 203. A valve 207, which is a first valve, is provided at the pipe 206. The storage chamber 210 and the process chamber 2 communicate with each other or are shut off from each other by the valve 207 being opened or closed.

A pipe 208 is connected between the valve 207 of the pipe 206 and the storage chamber 210 (the cover wall 203 in FIG. 4). A valve 209, which is a second valve, is provided at the pipe 208. A pipe 218 is provided at a downstream side of the valve 209 and is removable. An inert gas source 217 is connected to the pipe 218. The inert gas source 217 and the pipe 208 communicate with each other or are shut off from each other by the valve 209 being opened or closed. The valve 209 may also be provided at the pipe 206. If the valve 209 is provided at the pipe 206, the pipe 208 is not provided. In this case, the valve 209 is also used as a confluence part for joining the pipe 218 and the pipe 208.

The communication pipe 212 is provided inside the bottom wall 202. The communication pipe 212 extends in the direction of gravity from the hole structure 211a of the recess 211, is bent sideward not to pass through the mounting surface 202a, and then extends in a direction other than the direction of gravity. In the present embodiment, the "direction other than the direction of gravity" refers to, for example, a direction opposite the direction of gravity, e.g., a direction toward the cover wall 203. In this way, the mounting surface 202a can be mounted on the weight detector 221. Although an example in which the communication pipe 212 extends in a direction other than the direction of gravity, e.g., the direction toward the cover wall 203 is described in the present embodiment, the embodiment is not limited thereto. For example, the communication pipe 212 may have any structure as long as a liquid is discharged therefrom, and the communication pipe 212 may also extend in a horizontal direction when viewed in the direction of gravity.

A valve 214, which is a third valve, is provided at the discharge pipe 213. The discharge pipe 213 may be connected to a cleaning device, which will be described below, or a discharge tank. The valve 214 is closed during a substrate processing mode in which a substrate is processed and opened during a maintenance mode in which a liquid is discharged to the cleaning device or the discharge tank.

In the present embodiment, the relationship between the diameters of the sidewall 201b, the recess 211, the communication pipe 212, and the discharge pipe 213 is as follows. That is, the relationship, "diameter of sidewall 201b>diameter of recess 211>diameter of communication pipe 212>diameter of discharge pipe 213" is established. In other words, a diameter of a flow path through which a liquid flows decreases progressively in a direction in which the liquid is discharged. In this way, the capillary tube phenomenon, which will be described below, can be realized in a route along the recess 211, the communication pipe 212, and the discharge pipe 213.

More preferably, each of a connecting portion between the recess 211 and the communication pipe 212 and a connecting portion between the communication pipe 212 and the discharge pipe 213 has a structure without a step. Also, each of the connecting portions preferably has a structure without a branch. In this way, retention of liquid or entrance of air bubbles may be prevented at the connecting portions. Further, this enables to set a pressure of a liquid discharge path to be linear. The linear pressure allows the liquid to smoothly move through the liquid discharge path.

The liquid material supply pipe 204 serves as a liquid supply flow path configured to supply a liquid material to the storage chamber 210. The liquid material supply pipe 204 is provided at a wall other than the bottom wall 202. For example, the liquid material supply pipe 204 is provided in the cover wall 203. In case the liquid material supply pipe 204 is provided in the cover wall 203, the liquid material supply pipe 204 passes through a hole provided in the cover wall 203. One end of the liquid material supply pipe 204 is connected to the liquid material source 71 via the supply pipe 47a, and the other end of the liquid material supply pipe 204 is retained in the storage chamber 210. The valve 205 is provided at the liquid material supply pipe 204. The storage chamber 210 communicates with or is shut off from the first mass flow controller 49 or the liquid material source 71 by the valve 205 being opened or closed.

The heater 215 is provided at an outer periphery of the sidewall 201. The heater 215 heats the storage chamber 210. In particular, according to the present embodiment, the heater 215 heats the liquid material 216 stored in the storage chamber 210 and vaporizes the liquid material 216.

In the present embodiment, the sidewall 201, the bottom wall 202, the cover wall 203, the pipe 206, the storage chamber 210, the recess 211, the communication pipe 212 and the discharge pipe 213 are collectively referred to as a "storage device." The storage device may further include any one of the heater 215, the valve 207, the valve 205, and the valve 214 or a combination thereof. The storage device may further include the weight detector 221.

Controller

The substrate processing apparatus includes the controller 41 configured to control the operation of the components of the substrate processing apparatus.

Figure 5:
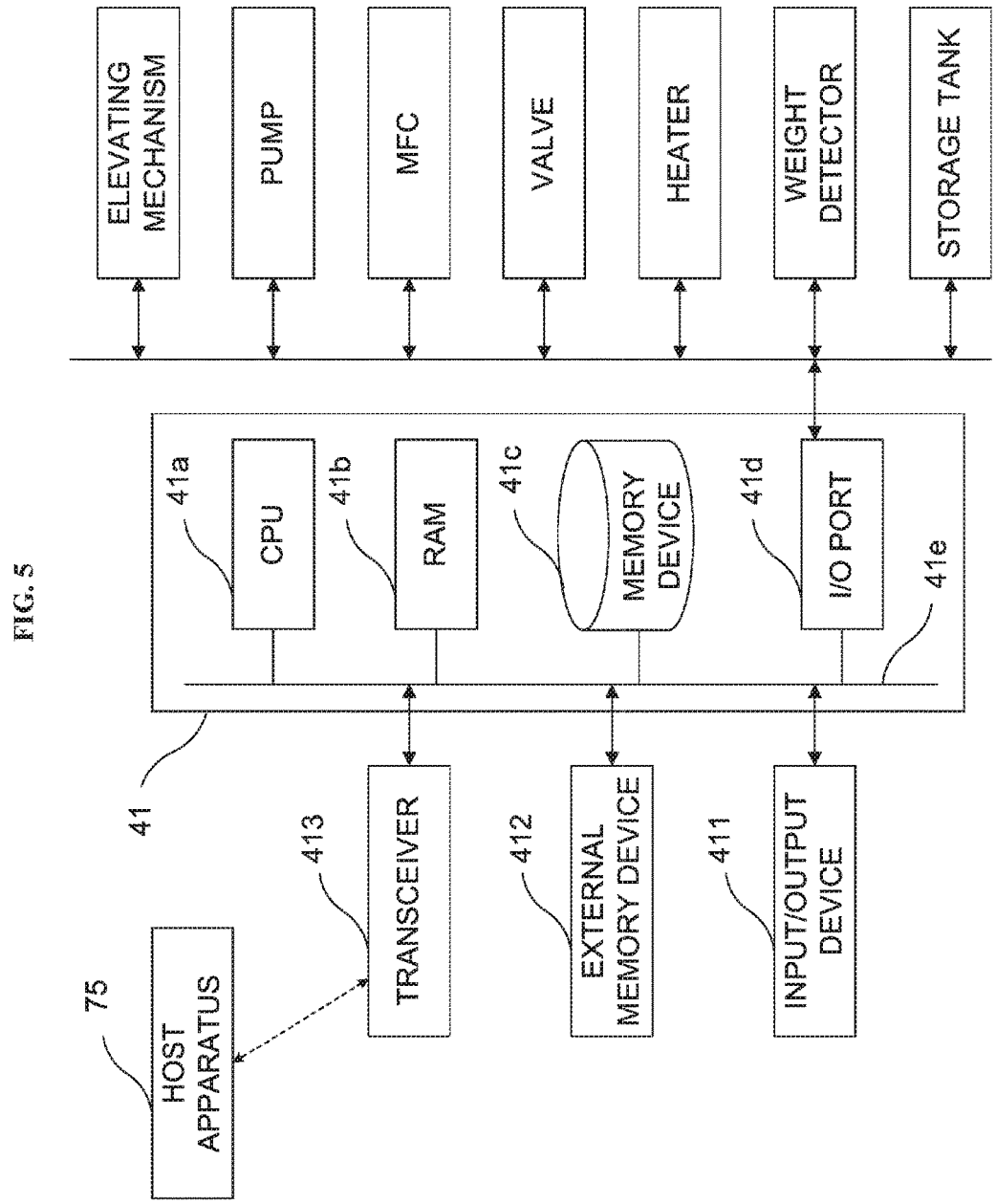
FIG. 5 is a block diagram schematically illustrating a configuration of a controller and components controlled by the controller of the processing apparatus according to the first embodiment.

FIG. 5 schematically illustrates the configuration of the controller 41. The controller 41, which is a control device (control means), may be embodied by a computer including a central processing unit (CPU) 41a, a random access memory (RAM) 41b, a memory device 41c and an I/O port 41d. The RAM 41b, the memory device 41c and the I/O port 41d are capable of exchanging data with the CPU 41a via an internal bus 41e. An input/output device 411 such as a touch panel and an external memory device 412 are connected to the controller 41. A transceiver 413 may be connected to the controller 41. The transceiver 413 is electrically connected to a host apparatus 75 through a network. The transceiver 413 is capable of receiving information such as information of another apparatus from the host apparatus 75.

The memory device 41c is embodied by components such as a flash memory and a hard disk drive (HDD). A control program for controlling the operation of the substrate processing apparatus, a process recipe having information such as sequences and conditions of the substrate processing which will be described later, and a maintenance program which will be described later are readably stored in the memory device 41c. The process recipe, which functions as a program, is created by combining steps of the substrate processing apparatus in the substrate processing mode such that the controller 41 may execute the steps to acquire a predetermine result. The maintenance program refers to a control program of the substrate processing apparatus in the maintenance mode which will be described later. Hereafter, the process recipe, the maintenance program and the control program are collectively referred to as "program." Herein, "program" may indicate only the process recipe, only the control program, or both. The RAM 41b is a work area where a program or data read by the CPU 41a is temporarily stored.

The I/O port 41d is connected to the components such as the elevating mechanism 34, the heaters 42 and 215, the mass flow controllers (MFCs) 49, 54, 58 and 62 and the valves 52, 55, 59, 63, 67, 205, 207, 209 and 214.

The controller 41 controls various operations such as flow rate adjusting operations of the mass flow controllers (MFCs) 49, 54, 58 and 62, opening/closing operations of the valves 52, 55, 59, 63, 67, 205, 207, 209 and 214, temperature adjusting operations of the heaters 42 and 215, a start and stop of the vacuum pump 68, a rotating operation of the boat rotating mechanism 69 and an elevating operation of the boat 32 by the elevating mechanism 34 of the boat elevator 33.

The controller 41 is not limited to a dedicated computer. The controller 41 may be embodied by a general-purpose computer. For example, the controller 41 may be embodied by installing the above-described program on a computer using the external memory device 412 storing the above-described program. The external memory device 412 may be embodied by a magnetic tape, a magnetic disk such as a hard disk and a flexible disk, an optical disk such as a CD and a DVD, a magneto-optical disk such as MO and a semiconductor memory such as a USB memory and a memory card. The method of providing the program to the computer is not limited to the external memory device 412. The program may be directly provided to the computer without using the external memory device 412 by a communication means such as the Internet and a dedicated communication line. The memory device 41c and the external memory device 412 are embodied by a computer-readable recording medium. Hereinafter, the memory device 41c and the external memory device 412 may be collectively referred to simply as "recording medium." Herein, the term "recording medium" may refer to only the memory device 41c, only the external memory device 412, or both.

Cleaning Device

Figure 6:
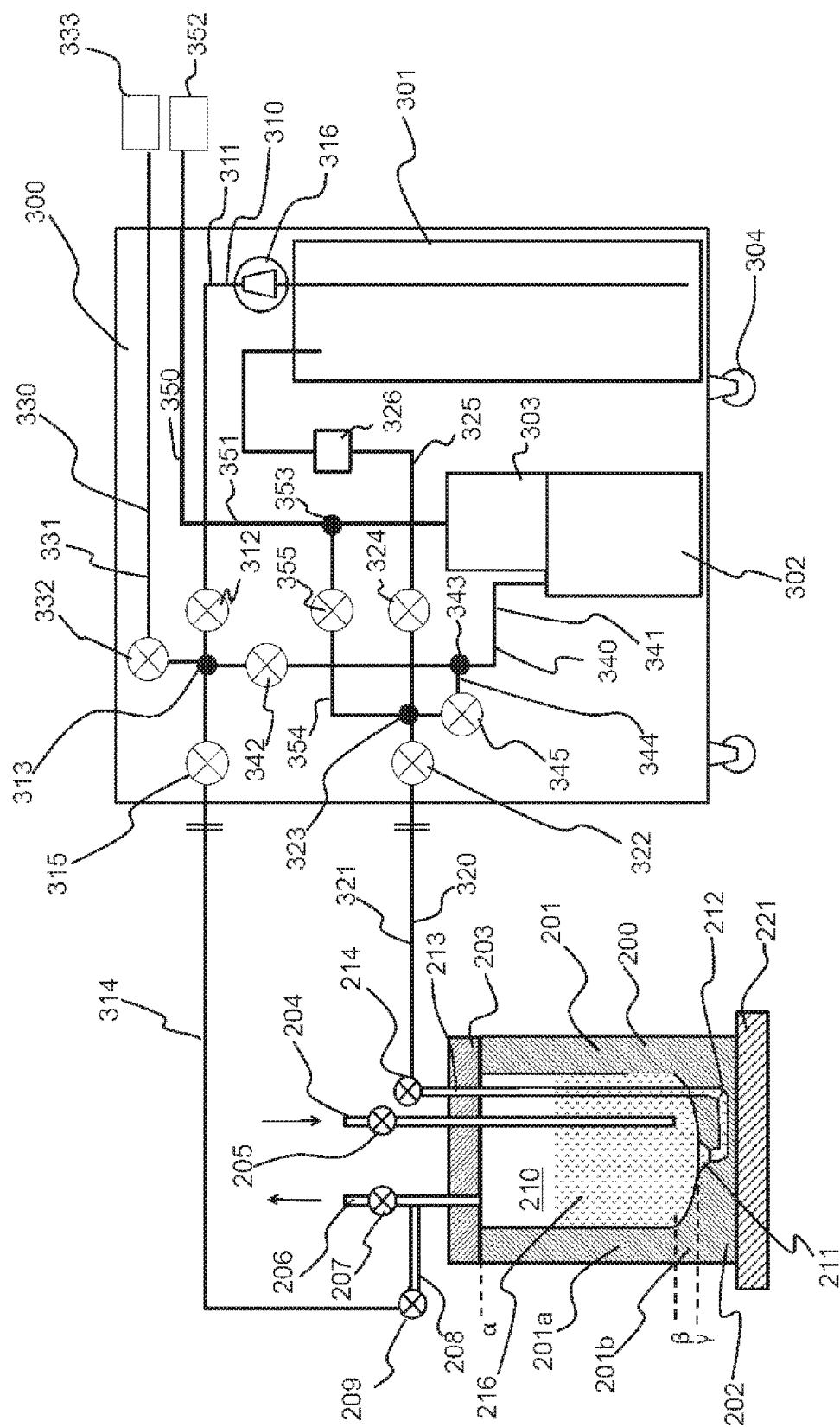
FIG. 6 schematically illustrates a vaporizer including a storage tank structure and a cleaning device according to the first embodiment.

Next, a cleaning device 300 that is used in a cleaning step which will be described later will be described with reference to FIG. 6. FIG. 6 is a view illustrating the cleaning device 300 and the vaporizer 51. In FIG. 6, the heater 215 is omitted for convenience of description.

The cleaning device 300 mainly includes a solvent tank 301, a vacuum pump 302, and a trap device 303. A tire 304 serving as a moving mechanism configured to move a housing of the cleaning device 300 up to a part in the vicinity of the vaporizer 51 is provided at the cleaning device 300.

Solvent Supply System

A solvent supply system 310 configured to transfer a solvent to the vaporizer 51 is provided at the solvent tank 301. The solvent supply system 310 includes a pipe 311 connected to the solvent tank 301. A valve 312 is provided at the pipe 311. A confluence part 313 configured to join a pipe other than the pipe 311 is provided at a downstream end of the pipe 311. A pipe 314 that is connectable to the valve 209 is provided between the confluence part 313 and the valve 209 of the vaporizer. A valve 315 is provided at the pipe 314.

Solvent Discharge System

A solvent discharge system 320 configured to return a solution used in cleaning the vaporizer 51 is provided at the solvent tank 301. The solvent discharge system 320 is connectable to the valve 214 of the vaporizer 51. The solvent discharge system 320 includes a pipe 321 having a valve 322. A confluence part 323 configured to join a pipe other than the pipe 321 is provided at a downstream side of the pipe 321. A pipe 325 including a valve 324 is provided between the confluence part 323 and the solvent tank 301. A particle counter 326 is provided at a downstream side of the valve 324 in the pipe 325.

Inert Gas Supply System

An inert gas supply system 330 configured to purge the solvent is connected to the solvent supply system 310. Specifically, an inert gas supply pipe 331 having a valve 332 is connected to the confluence part 313. An inert gas source 333 is connected to an upstream side of the inert gas supply pipe 331. The inert gas used in the present embodiment may be any material that does not generate waste after reacting with a solvent. For example, $N_2$ gas is used as the inert gas. The inert gas supply system mainly includes the inert gas supply pipe 331 and the valve 332. The inert gas supply system may further include the inert gas source 333 or the pipe 314.

Vacuum Exhaust System

A vacuum exhaust system 340 configured to adjust a pressure or the like in each pipe is connected to the solvent supply system 310. Specifically, a pipe 341 having a valve 342 and a confluence part 343 is connected to the confluence part 313. The vacuum pump 302 is connected to a side of the pipe 341 other than that close to the confluence part 313.

The vacuum exhaust system 340 is also connected to the solvent discharge system 320. Specifically, a pipe 344 having a valve 345 is connected to the confluence part 323. A side of the pipe 344 other than that close to the confluence part 323 is connected to the confluence part 343 of the pipe 341 and communicates with the vacuum pump 302.

Exhaust and Heating System

An exhaust and heating system 350 is connected to a downstream side of the trap device 303 connected to the vacuum pump 302. Specifically, a pipe 351 including a confluence part 353 is connected to the trap device 303. An exhaust and heating mechanism 352 is provided at a side of the pipe 351 other than that connected to the trap device 303. A pipe 354 including a valve 355 is provided between the confluence part 323 and the confluence part 353.

Substrate Processing Process

Next, an example of processing a substrate (wafer) using the above-described semiconductor manufacturing apparatus will be described. Herein, as an example of a manufacturing process of a semiconductor device, a cyclic process for forming a film by supplying a source (liquid material) and a reactive gas (reactant) alternately to the process chamber will be described. In the example, tetrakis ethylmethylamino hafnium ($Hf[N(C_2h_5)(CH_3)]_4$, abbreviated as TEMAH) is used as the source and ozone ($O_3$) is used as the reactive gas to form an $HfO_2$ film on the substrate. TEMAH is an example of the liquid source (liquid material).

First, as described above, the wafer 31 is charged in the boat 32 and the boat 32 charged with the wafer 31 is then loaded into the process chamber 2. As shown in FIG. 2, the vaporizer 51 is connected to the liquid material source 71. After the boat 32 is loaded into the process chamber 2, the following four steps are sequentially performed.

First Step

In a first step, with the heaters 42 and 215 in operation, TEMAH and the carrier gas such as $N_2$ gas is supplied onto the wafer 31. First, the valves 52, 55 and 67 are opened. After the flow rate of the TEMAH supplied to the supply pipe 47a is adjusted by the first mass flow controller 49, the TEMAH is supplied to the vaporizer 51 via the valve 205. The TEMAH is stored in the storage chamber 210 and is vaporized by the heater 215. The vaporized gaseous TEMAH is supplied to the supply pipe 47b via the pipe 206. The flow rate of carrier gas ($N_2$ gas) supplied to the first carrier gas supply pipe 53 is adjusted by the second mass flow controller 54. The carrier gas ($N_2$ gas) having the flow rate thereof adjusted and the vaporized gaseous TEMAH are mixed in the supply pipe 47b. The mixed gas is supplied into the process chamber 2 through the first gas supply holes 57 of the first nozzle 56, and exhausted through the gas exhaust pipe 66. The flow rate of TEMAH adjusted by the first mass flow controller 49 may range from 0.1 g/min to 0.3 g/min. The duration of the exposure of the wafer 31 to the vaporized gaseous TEMAH may range from 30 seconds to 180 seconds. The temperature of the heater 42 is adjusted such that the temperature of the wafer 31 may range from 180° C. to 250° C. The inner pressure of the process chamber 2 may range from 50 Pa to 100 Pa. As a result, a film containing hafnium (Hf) is formed on the wafer 31.

Second Step

In a second step, the valve 52 of the first gas supply pipe 47 and the valve 55 of the first carrier gas supply pipe 53 are closed to stop the supply of the TEMAH gas and the carrier gas. With the valve 67 of the gas exhaust pipe 66 open, the vacuum pump 68 vacuum-exhausts the substrate processing furnace 29 to 20 Pa or less to remove residual TEMAH gas from the process chamber 2. An inert gas such as the N2 gas serving as the carrier gas may be supplied to the substrate processing furnace 29. By supplying the inert gas, the efficiency of removing the residual TEMAH gas from the process chamber 2 is enhanced.

Third Step

In a third step, $O_3$ and the carrier gas such as $N_2$ gas is supplied onto the wafer 31. The valve 59 provided at the second gas supply pipe 48 and the valve 63 provided at the second carrier gas supply pipe 61 are opened. After the flow rate of the $O_3$ supplied to the second gas supply pipe 48 is adjusted by the third mass flow controller 58 and the flow rate of the carrier gas ($N_2$ gas) supplied to the second carrier gas supply pipe 61 is adjusted by the fourth mass flow controller 62, the $O_3$ having the flow rate thereof adjusted and the carrier gas ($N_2$ gas) having the flow rate thereof adjusted are mixed. The mixed gas is supplied into the process chamber 2 through the second gas supply holes 65 of the second nozzle 64, and exhausted through the gas exhaust pipe 66. The duration of the exposure of the wafer 31 to the $O_3$ may range from 10 seconds to 120 seconds. The temperature of the wafer 31 may range from 180° C. to 250° C., the same as the temperature of the wafer 31 of first step when the TEMAH is supplied. The inner pressure of the process chamber 2 may range from 50 Pa to 100 Pa, the same as the inner pressure of the process chamber 2 of first step when the TEMAH is supplied. By supplying $O_3$, a hafnia ($HfO_2$) film is formed on the wafer 31 by reacting $O_3$ with the film containing hafnium formed on the wafer 31 by the first step.

Fourth Step

In a fourth step, the valves 59 and 63 are closed. The vacuum pump 68 vacuum-exhausts the process chamber 2 to remove residual $O_3$ that has contributed to formation of the hafnia ($HfO_2$) film from the process chamber 2. The inert gas such as the $N_2$ gas serving as the carrier gas may be supplied to the process chamber 2. By supplying the inert gas, the efficiency of removing the residual $O_3$ from the process chamber 2 is enhanced.

The hafnia ($HfO_2$) film having desired thickness is formed on the wafer 31 by performing a cycle including the first step through the fourth step once or more.

Maintenance Process

Hereinafter, a maintenance process according to the first embodiment will be described. For example, a maintenance process of the vaporizer 51 will be described as the maintenance process according to the first embodiment.

The maintenance process of the vaporizer 51 is performed when operation of the vaporizer 51 is started or when the processing apparatus is to be maintained. In the maintenance process, a liquid is removed from the storage chamber 210 and is replaced by another, and the storage chamber 210 is cleaned.

Hereinafter, components of the vaporizer 51 and the storage device according to the present embodiment will be described in detail in contrast to comparative examples.

Description of Comparative Examples of Maintenance Process

Figure 8:
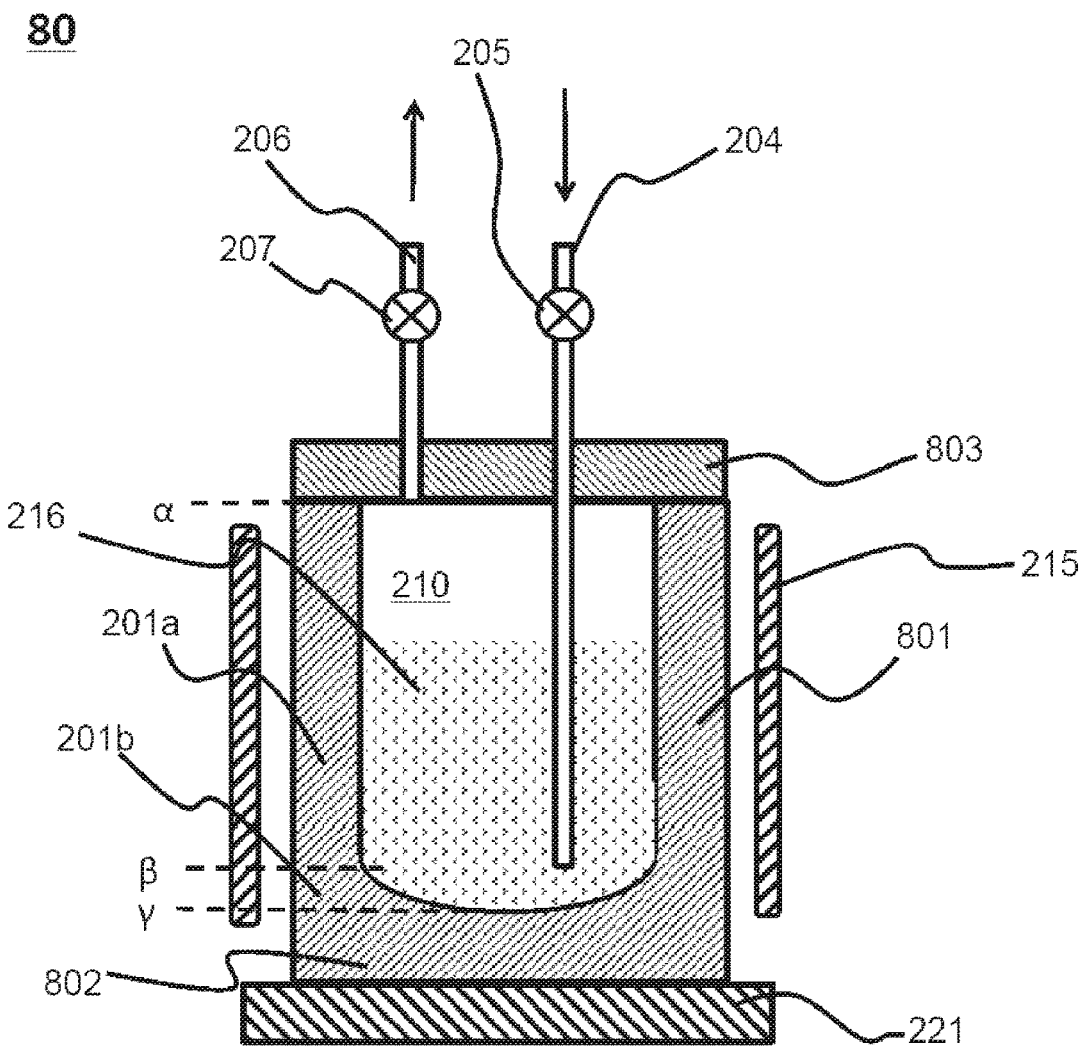
FIG. 8 schematically illustrates a vaporizer according to a first comparative example.
Figure 9:
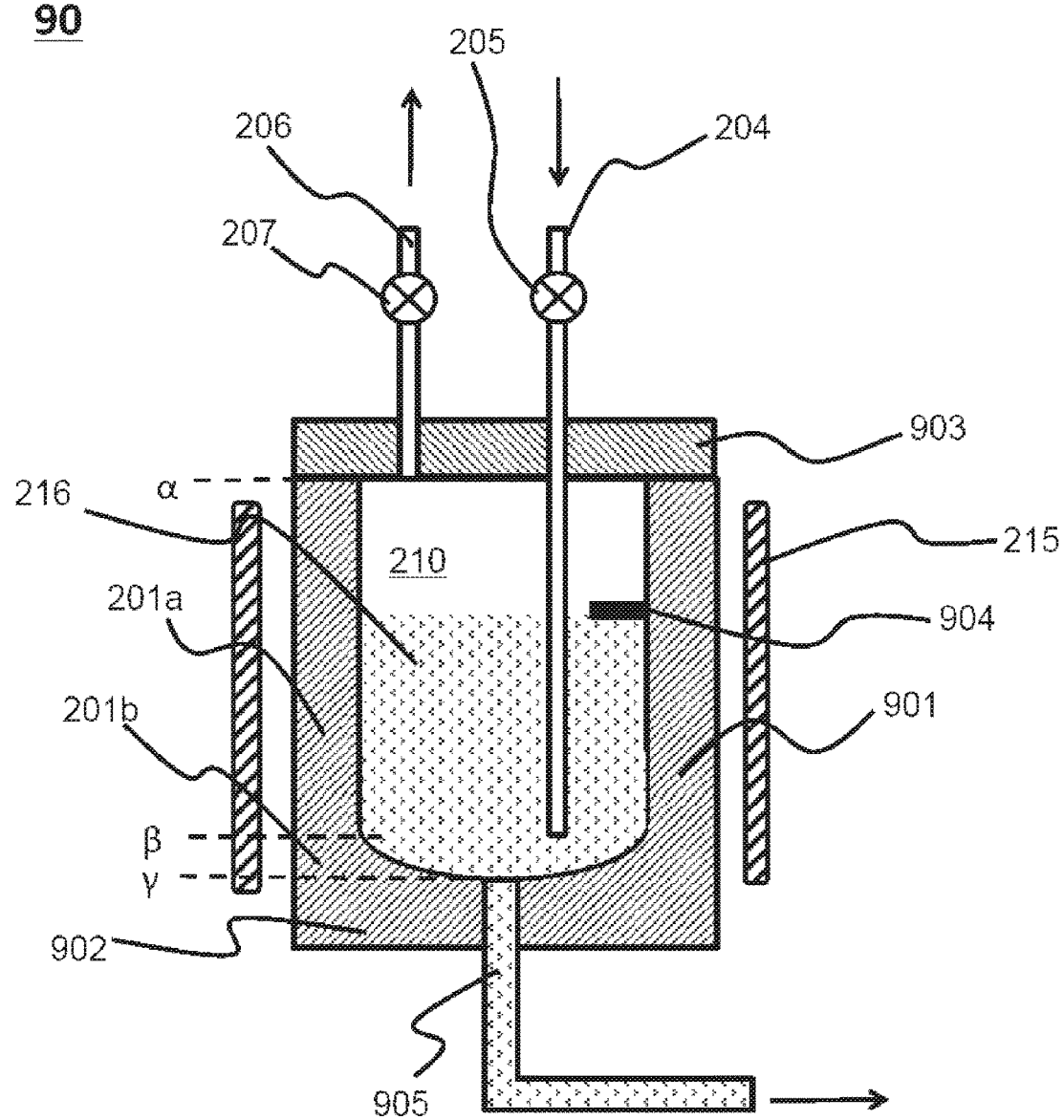
FIG. 9 schematically illustrates a vaporizer according to a second comparative example.

First, two comparative examples will be described with reference to FIGS. 8 and 9. FIG. 8 illustrates a vaporizer 80 according to a first comparative example, and FIG. 9 illustrates a vaporizer 90 according to a second comparative example. In the following description, description of components of the vaporizer 80 and the vaporizer 90 which are the same as the components of the vaporizer 51 will be omitted, and differences therebetween will be mainly described.

Although the vaporizer 80 includes a sidewall 801, a bottom wall 802, and a cover wall 803 like the vaporizer 51, the vaporizer 80 is different from the vaporizer 51 in that the vaporizer 80 does not include the recess 211, the communication pipe 212 continuously extending therefrom, and the discharge pipe 213.

Maintenance process performed on the vaporizer 80 will be described. Here, "maintenance" means, for example, liquid removal, liquid replacement, and cleaning. To perform maintenance while taking downtime into consideration, it is necessary to remove liquid in a state where the vaporizer 80 is mounted on the weight detector 221.

Since, as in the vaporizer 51, the sidewall 801 and the cover wall 803 of the vaporizer 80 are connected by a method such as welding for the purpose of safety, it is difficult to open or close the cover wall 803. Although a liquid may be discharged through the liquid material supply pipe 204, due to structural factors, it is difficult to remove liquid stored between the bottom wall 802 and a front end of the liquid material supply pipe 204. To remove the liquid in the above configuration, for example, a distance between the bottom wall 802 and the front end of the liquid material supply pipe 204 may be significantly shortened. However, in such a case, the front end of the liquid material supply pipe 204 comes into contact with the bottom wall 802, and there is a concern about damage to the liquid material supply pipe 204 or the bottom wall 802. Since debris generated due to damage becomes waste in wafer processing, the above-described structure is not practical.

The vaporizer 80 according to the first comparative example has the above-described problems, and since the vaporizer 80 does not have the recess 211, the communication pipe 212, and the discharge pipe 213, it is difficult for a liquid to be discharged from the storage chamber 210.

Next, the vaporizer 90 according to the second comparative example will be described. Although the vaporizer 90 includes a sidewall 901, a bottom wall 902, and a cover wall 903 like the vaporizer 51, the vaporizer 90 is different from the vaporizer 51 in that the bottom wall 902 includes different elements and is not mountable on a weight detector.

The vaporizer 90 will be described in detail below. The vaporizer 90 includes a liquid level detector 904. The liquid level detector 904 is configured to detect a liquid level in the storage chamber 210. A residual quantity of liquid is detected by detecting the liquid level. A discharge pipe 905 is provided in the bottom wall 902. According to the second comparative example, since the residual quantity of liquid is detected by the liquid level detector 904 instead of the weight detector 221 of the first embodiment, a space is formed at a lower portion of the bottom wall 902. This makes it possible to provide the discharge pipe 905 configured to discharge a liquid in the direction of gravity. The discharge pipe 905 passes through the bottom wall.

However, since the liquid level detector 904 sometimes fails to follow the fluctuation of liquid, it is difficult to measure an accurate residual quantity of liquid. Also, when there is no liquid in the storage chamber 210, a detection tool of the liquid level detector 904 collides with the bottom of the storage tank, thereby generating waste as a result.

Maintenance Process of Present Embodiment

As described above, there are various problems according to the first comparative example and the second comparative example. According to the present embodiment, the problems according to the comparative examples may be solved by the recess 211, the communication pipe 212 extending continuously from the recess 211, and the discharge pipe 213 provided as illustrated in FIG. 4. Maintenance process using the structure of the present embodiment will be described in detail below.

Liquid Removing Step

First, the reason for performing liquid removal in the maintenance process will be described. As described above, the vaporizer 51 mainly includes the sidewall 201, the bottom wall 202, and the cover wall 203. To prevent leakage of a liquid stored in the storage chamber 210 to the outside, each of the walls is fixed by a method such as welding.

When a conventional vaporizer is used for the first time, waste is generated from the vaporizer upon use. As a result of keen research, the inventor of the present application found out that the generation of waste is due to the degree of cleanliness in the vaporizer not having reached a desired level or a welded portion of the vaporizer being corroded due to contact between a liquid material and the welded portion. Although a vaporizer that has just been shipped has been described as an example, the embodiment is not limited thereto. It was found out that even when, for example, a vaporizer has been used for a long period of time, corrosion occurs due to a liquid material and waste is generated. Therefore, upon the first use of a vaporizer or when performing maintenance on a vaporizer, it is required to remove waste from the vaporizer.

Nowadays, to deal with various kinds of processing, it is required to deal with a plurality of materials in a single processing apparatus. Even when a plurality of materials are dealt with in a single processing apparatus, it is required to replace materials with a tank mounted on the processing apparatus for an increase in downtime to be prevented.

Even in a case of dealing with a plurality of materials, when a component constituting a liquid material used prior to liquid replacement remains in the storage chamber 210, the previously-used liquid material and a new liquid material to be used react, and a by-product is generated in the storage chamber 210. When the generated by-product is moved from the pipe 206 to the process chamber 2 and attached to a substrate, the quality of the substrate may be degraded or yield may be reduced.

Although swapping tanks in which different liquids are stored may be taken into consideration to prevent generation of by-product, a large amount of time is required in swapping tanks due to the following reasons. That is, although it is necessary to transport a tank with a liquid removed therefrom to improve safety, when, for example, the liquid to be removed has a low vapor pressure, it is necessary to purge the liquid for about 24 hours. Therefore, when the method of swapping tanks is used, downtime increases.

Therefore, according to the present embodiment, a liquid is removed from the vaporizer 51 so that a residual product is not generated while the vaporizer 51 is mounted on the processing apparatus. A detailed method thereof will be described below.

In a liquid removing step in which liquid removal is performed, first, the discharge pipe 213 and a liquid tank (not shown) are connected. Then, while the pipe 218 is connected, the valve 207 is closed and the valve 209 is opened. Also, the valve 205 is closed and the valve 214 is opened. By controlling opening and closing of the valves in this way, the inert gas source 217 communicates with the liquid tank. An inert gas supplied from the inert gas source 217 is supplied to an inner portion of the storage chamber 210 and pressurizes the liquid material 216 remaining in the storage chamber 210. The pressurized liquid material 216 is discharged through the discharge pipe 213 via the recess 211 and the communication pipe 212.

However, as described above, in the storage tank structure 200, the relationship "diameter of sidewall 201*b*>diameter of recess 211>diameter of communication pipe 212>diameter of discharge pipe 213" is established. Therefore, due to the capillary tube phenomenon, the liquid material 216 rises to a position higher than the bottom wall 202.

According to the present embodiment, since the remaining liquid material 216 is further pressurized, a pressure applied to the liquid material 216 when the recess 211, the communication pipe 212 and the discharge pipe 213 are filled by the liquid material 216 is defined by the relationship "pressure of sidewall 201*b*>pressure of recess 211>pressure of communication pipe 212>pressure of discharge pipe 213," and an upstream and downstream pressure difference is generated. Therefore, the liquid material 216 pressurized by the inert gas passes through the recess 211, is deflected in a direction other than the direction of gravity due to the communication pipe 212, rises along the discharge pipe 213, and is moved to the liquid tank.

Although pressurizing the liquid material 216 remaining in the storage chamber 210 in the present step has been described as an example, the embodiment is not limited thereto as long as a pressure difference can be generated between the recess 211 and the downstream side of the discharge pipe 213. For example, the liquid material 216 may also be suctioned from the downstream side of the discharge pipe 213.

Cleaning Step

Next, a cleaning step will be described. In the cleaning step, a cleaning process is performed on the storage chamber 210. An example in which cleaning is performed, in consideration of downtime, in a state where the vaporizer 51 is mounted on the substrate processing apparatus will be described below as an example.

First, as illustrated in FIG. 6, the movable cleaning device 300 is connected to the vaporizer 51. Specifically, the valve 214 is closed, and the pipe 218 is removed while the valve 207 and the valve 209 are closed. Then, the valve 209 and the pipe 314 are connected, and the valve 214 and the pipe 321 are connected. In this way, the pipes are connected as illustrated in FIG. 6. In this case, all valves of the cleaning device 300 are closed.

Then, the vacuum pump 302 is operated. Then, the valve 342 is opened to allow communication between the confluence part 313 and the pipe 341. The valve 345 is opened in conjunction with opening the valve 342 to allow communication between the confluence part 323 and the pipe 341. An atmospheric pressure in the pipe 341 is set to be, for example, 0.01 Pa or lower.

When the atmosphere in the pipe 341 reaches a predetermined pressure, the valve 315 is opened to allow communication between the pipe 314 and the vacuum pump 302. By opening the valve 322 together with opening the valve 315, communication is likewise allowed between the pipe 321 and the vacuum pump 302, and a leakage check is performed on a portion such as a connection point with the vaporizer 51.

When the leakage check has been completed and it is determined that there is no leakage, the valve 209 and the valve 214 are opened to allow communication with the vacuum pump 302. The inner portion of the storage chamber 210 is vacuum-exhausted by the vacuum pump 302.

When a pressure of the storage chamber 210 reaches a predetermined pressure, the valve 342 and the valve 345 are closed to shut off the storage chamber 210 and the vacuum pump 302 from each other.

Then, the valve 312 is opened to allow communication with a pipe in the solvent supply system 310. By opening the valve 324 together with opening the valve 312, communication with the solvent discharge system 320 is allowed. In this way, a fresh solvent may be supplied from the solvent tank 301 to the storage chamber 210 via the solvent supply system 310. Also, the solvent used in cleaning the storage chamber 210 may be supplied from the storage chamber 210 to the solvent tank 301 via the solvent discharge system 320.

Then, a liquid circulation pump 316 is operated to circulate the solvent, and cleaning of the storage chamber 210 is performed. During the cleaning, a concentration of particle components of a solvent that has passed through the pipe 325 is extracted by the particle counter 326. When the concentration of the particle components becomes lower than a predetermined value, it is determined that cleaning has been completed, and the liquid circulation pump 316 is stopped.

When the cleaning process has been completed, the solvent remaining in the storage chamber 210 is removed. Specifically, the valve 312 is closed, and the valve 332 is opened. In this way, the solvent tank 301 and the storage chamber 210 are shut off from each other, and communication is allowed between the storage chamber 210 and the inert gas source 333. An inert gas supplied from the inert gas source 333 is supplied to the storage chamber 210 via the pipe 331 and the pipe 314. The supplied inert gas discharges the solvent remaining in the pipe 314 or the storage tank structure 200 to the solvent tank 301 and recovers the solvent.

Then, the valve 324 is closed, and the valve 355 is opened. In this way, communication is allowed between the exhaust and heating mechanism 352 and the storage chamber 210. In this state, an inert gas is supplied for a predetermined amount of time so that the remaining solvent is discharged from components such as the pipe 314 and the storage chamber 210.

Then, the valve 332 is closed so that the storage chamber 210 and the inert gas source 333 are shut off from each other. Also, the valve 355 is closed. By opening the valve 342 and the valve 345 together with closing the valve 355, the storage chamber 210, the pipe 314 and the pipe 321 are allowed to communicate with the vacuum pump 302. The vacuum pump 302 vacuum-exhausts the storage chamber 210.

When the storage chamber 210 reaches a predetermined pressure, the valve 342 and the valve 345 are closed, and the vacuum exhaust process is stopped. In this case, the predetermined pressure refers to, for example, a pressure of 0.01 Pa or lower.

Then, the valve 332 is opened to allow communication between the storage chamber 210 and the inert gas source 333 in order to fill the storage chamber 210 with an inert gas. Then, all valves are closed, and the pipe 314 and the pipe 321 are removed from the vaporizer 51.

By performing the maintenance process as described above, the remaining solvent may surely be discharged with short downtime. Therefore, overall downtime may be shortened, and productivity may be improved as a result.

Second Embodiment

Figure 7:
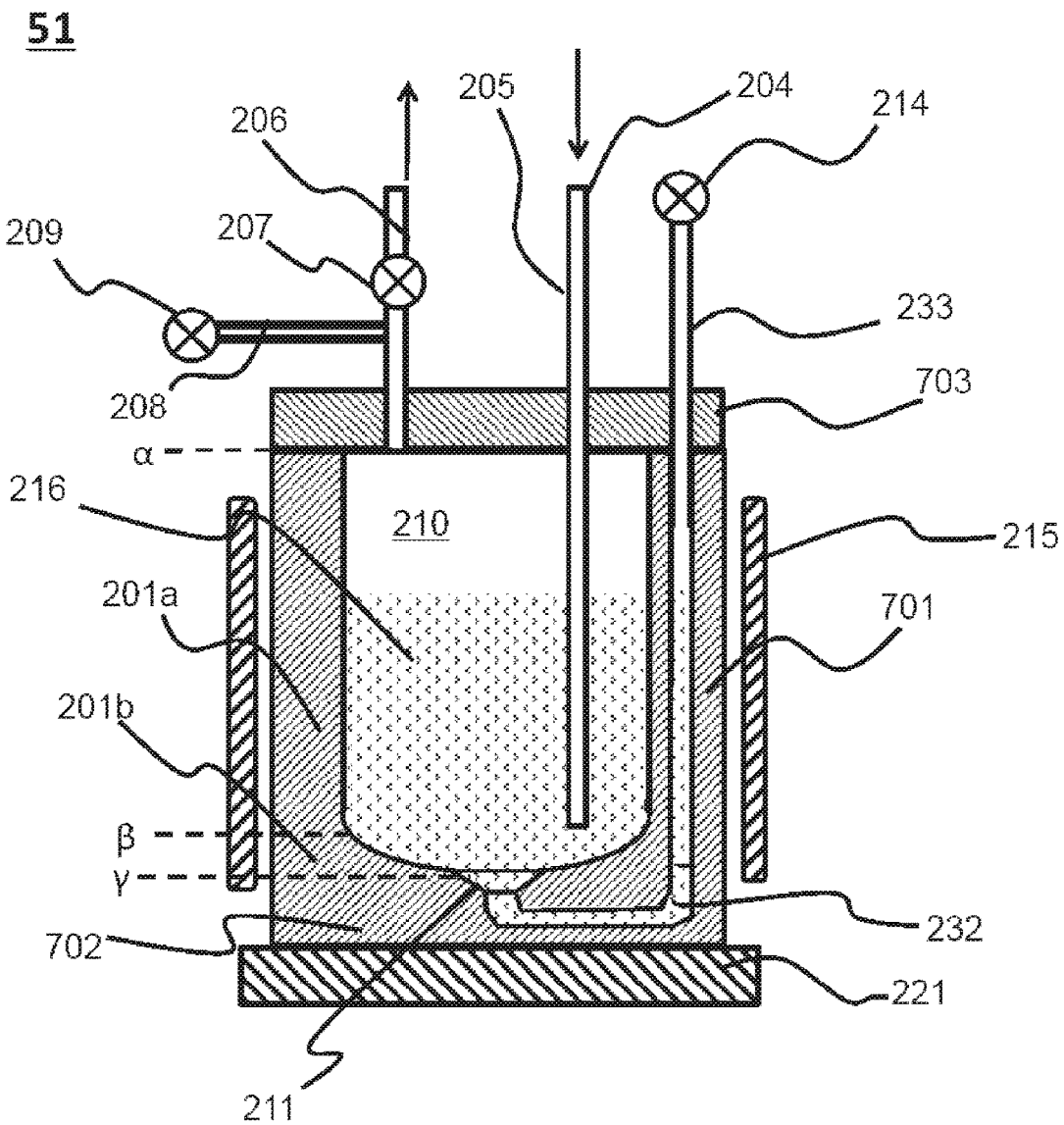
FIG. 7 schematically illustrates a vaporizer including a storage tank structure according to a second embodiment described herein.

Next, a second embodiment will be described with reference to FIG. 7. Differences between the second embodiment and the first embodiment will be mainly described. Components of the second embodiment that are the same as the components of the first embodiment will be denoted by like reference numerals, and detailed description thereof will be omitted.

A vaporizer 51 according to the second embodiment includes a sidewall 701, a bottom wall 702, and a cover wall 703. The vaporizer 51 according to the second embodiment further includes a communication pipe 232 and a discharge pipe 233. Unlike the first embodiment, in the vaporizer 51 according to the second embodiment, the discharge pipe 233 is embedded in the sidewall 701, and the communication pipe 232 extends to a position at which the communication pipe 232 is connectable to the discharge pipe 233. According to the second embodiment, the vaporizer 51 includes a heater 215, which is the same as the heater 215 of the first embodiment.

According to the first embodiment, since a portion of the discharge pipe 213 is disposed in the storage chamber 210, a space of the storage chamber 210 and the sidewall 201 are present between the discharge pipe 213 and the heater 215. As described above, a liquefied material or a gaseous material is present in the storage chamber 210. Since the temperature at a point adjacent to a liquefied material is different from the temperature at a point adjacent to a gaseous material, temperatures may vary, for example, at upstream and downstream sides of the discharge pipe 213. Since thermal expansion rates of liquids vary due to the varying temperatures, a pressure may be unstable between the upstream and downstream sides of the discharge pipe 213. Besides, due to temperature being lowered, a phenomenon such as solidification of liquid may occur. Since the above-described phenomenon becomes more pronounced in accordance with properties of a liquid material, for example, it is preferable to make temperatures uniform at the upstream and downstream sides of the discharge pipe 213.

Therefore, according to the second embodiment, the discharge pipe 233 is implemented with a structure in which the discharge pipe 233 is embedded in the sidewall 701. Since heat dissipated from the heater 215 is uniformly distributed within the sidewall 701, the influence of heat may be made uniform throughout upstream and downstream sides of the discharge pipe 233. More preferably, the discharge pipe 233 is provided in a direction in which the heater 215 extends. In this way, the influence of heat may be made more uniform throughout the upstream and downstream sides. Therefore, a pressure of liquid passing through the discharge pipe 233 does not become unstable, and temperatures also become stable.

According to the second embodiment described above, the remaining solvent is surely discharged with short downtime. In this way, overall downtime may be shortened, and productivity may be improved as a result.

Other Embodiments

While the technique is described by way of the above-described embodiments, the above-described technique is not limited thereto. The above-described technique may be modified in various ways without departing from the gist thereof.

For example, in the above-described embodiments, a film-forming process for semiconductor device performed by the substrate processing apparatus is described by an example wherein TEMAH and $O_3$ gas are alternately supplied as the source (liquid material) and the reactive gas (reactant), respectively, to form a hafnia (HfO) film on the wafer (W). However, the above-described technique is not limited thereto. For example, the above-described technique may be applied to film-forming processes wherein liquid other than TEMAH is used as the source and gases other than $O_3$ gas which react with the liquid other than TEMAH is used as the reactive gas to form different films. The above-described technique may be applied to film-forming processes wherein three or more different gases are supplied in turn to form a film.

For example, although the above-described embodiments have been described on the basis of an example in which the vaporizer is connected to the cleaning device 300, the above-described technique is not limited thereto. For example, when only discharging of a liquid is performed, the vaporizer may be connected to a waste liquid device. For example, although the above-described embodiments have been described on the basis of an example in which a gas flow path is provided in a cover wall, the above-described technique is not limited thereto. The above-described technique may also be applied to a case in which a gas flow path is provided in a sidewall.

While the embodiments are described by way of an example wherein a film-forming process for semiconductor device is performed in the substrate processing apparatus, the above-described technique is not limited thereto. For example, the above-described techniques may be applied to other processes such as annealing process, oxidation process, nitridation process, diffusion process and lithography process. The above-described technique may also be applied to other substrate processing apparatuses such as an annealing apparatus, an oxidation apparatus, a nitridation apparatus, an exposure apparatus, a coating apparatus, a drying apparatus, a heating apparatus, a processing apparatus using plasma and combinations thereof.

A semiconductor manufacturing process has been described as an example in the above-described embodiments. However, the above-described technique is not limited thereto. For example, the above-described technique may be applied to components such as a liquid material tank in which a liquid is stored that requires a high degree of purity of a liquid, an intermediate storage tank, or a liquid tank embedded in a vaporizer in the chemical industry field. In this case, "liquid" refers to a liquid such as pure water, hydrogen peroxide solution, ammonia solution, alcohols, and organic acids.

The above-described technique may also be applied when a constituent of one of the above-described embodiments is substituted with another constituent of other embodiments, or when a constituent of one of the above-described embodiments is added to other embodiments. The above-described technique may also be applied when the constituent of the examples is omitted or substituted, or when a constituent added to the embodiments.

According to the technique described herein, a processing apparatus capable of achieving high productivity or a structure for realizing high productivity can be provided.

What is claimed is:

1. A storage device comprising:
a sidewall formed in a cylindrical shape;
a cover wall disposed at an upper end of the sidewall;
a bottom wall connected to a lower end of the sidewall and comprising a mounting surface mountable on a weight detector;
a storage chamber surrounded by the sidewall, the cover wall, and the bottom wall;
a recess communicating with the storage chamber and provided at the bottom wall;
a communication pipe comprising an upstream portion connected directly to a bottom portion of the recess and extending in a vertically downward direction with a diameter smaller than that of the recess, a downstream portion extending in a vertically upward direction in the bottom wall, and a middle portion disposed between the upstream portion and the downstream portion;
a gas flow path provided at a wall other than the bottom wall; and
a discharge pipe connected directly to the downstream portion of the communication pipe and extending in a direction same as that of the downstream portion of the communication pipe with a diameter smaller than that of the downstream portion of the communication pipe.

2. The storage device of claim 1, wherein the communication pipe is provided inside the bottom wall.

3. The storage device of claim 1, wherein a diameter of the storage chamber decreases progressively toward the bottom wall.

4. The storage device of claim 3, wherein the communication pipe is provided inside the bottom wall.

5. The storage device of claim 1, wherein the discharge pipe is connectable to a pump.

6. The storage device of claim 5, wherein the communication pipe is provided inside the bottom wall.

7. The storage device of claim 5, wherein a diameter of the storage chamber decreases progressively toward the bottom wall.

8. The storage device of claim 1, wherein the discharge pipe is configured to pass through the sidewall.

9. The storage device of claim 8, wherein the communication pipe is provided inside the bottom wall.

10. The storage device of claim 8, wherein a diameter of the storage chamber decreases progressively toward the bottom wall.

11. A vaporizer comprising:
a storage device comprising:
a sidewall formed in a cylindrical shape;
a cover wall disposed at an upper end of the sidewall;
a bottom wall connected to a lower end of the sidewall and comprising a mounting surface mountable on a weight detector;
a storage chamber surrounded by the sidewall, the cover wall, and the bottom wall;
a recess communicating with the storage chamber and provided at the bottom wall;
a communication pipe comprising an upstream portion connected directly to a bottom portion of the recess and extending in a vertically downward direction with a diameter smaller than that of the recess, a downstream portion extending in a vertically upward direction in the bottom wall, and a middle portion disposed between the upstream portion and the downstream portion;
a gas flow path provided at a wall other than the bottom wall; and
a discharge pipe connected directly to the downstream portion of the communication pipe and extending in a direction same as that of the downstream portion of the communication pipe with a diameter smaller than that of the downstream portion of the communication pipe; and
a heater configured to heat the storage chamber.

12. A substrate processing apparatus comprising:
a vaporizer comprising:
  a storage device comprising:
    a sidewall formed in a cylindrical shape;
    a cover wall disposed at an upper end of the sidewall;
    a bottom wall connected to a lower end of the sidewall and comprising a mounting surface mountable on a weight detector;
    a storage chamber surrounded by the sidewall, the cover wall, and the bottom wall;
    a recess communicating with the storage chamber and provided at the bottom wall,
    a communication pipe comprising an upstream portion connected directly to a bottom portion of the recess and extending in a vertically downward direction with a diameter smaller than that of the recess, a downstream portion extending in a vertically upward direction in the bottom wall, and a middle portion disposed between the upstream portion and the downstream portion,
    a gas flow path provided at a wall other than the bottom wall; and
    a discharge pipe connected directly to the downstream portion of the communication pipe and extending in a direction same as that of the downstream portion of the communication pipe with a diameter smaller than that of the downstream portion of the communication pipe;
  and
  a heater configured to heat the storage chamber;
a process chamber communicating with the vaporizer; and
a substrate support configured to support a substrate inside the process chamber.

13. The substrate processing apparatus of claim 12, wherein, during a substrate processing mode in which the substrate is processed in the process chamber, the gas flow path communicates with the process chamber and the discharge pipe communicates with a liquid material source in a state in which the bottom wall is supported by the weight detector; and during a maintenance mode in which maintenance is performed inside the storage device, the gas flow path communicates with an inert gas source and the discharge pipe is connected to one of a waste liquid device and a cleaning device in a state in which the bottom wall is mounted on the weight detector.

* * * * *